United States Patent
Fang et al.

(10) Patent No.: US 7,064,025 B1
(45) Date of Patent: Jun. 20, 2006

(54) METHOD FOR FORMING SELF-ALIGNED DUAL SALICIDE IN CMOS TECHNOLOGIES

(75) Inventors: Sunfei Fang, LaGrangeville, NY (US); Cyril Cabral, Jr., Mahopac, NY (US); Chester T. Dziobkowski, Hopewell Junction, NY (US); John J. Ellis-Monaghan, Grand Isle, VT (US); Christian Lavoie, Ossining, NY (US); Zhijiong Luo, Carmel, NY (US); James S. Nakos, Essex, VT (US); An L. Steegen, Stamford, CT (US); Clement H. Wann, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/904,884

(22) Filed: Dec. 2, 2004

(51) Int. Cl.
  *H01L 21/8238* (2006.01)
(52) U.S. Cl. .................. 438/199; 438/233; 438/586; 438/664; 438/682
(58) Field of Classification Search ............... 438/199, 438/233, 586, 664, 682, FOR 216, FOR 187
See application file for complete search history.

(56) References Cited

U.S. PATENT DOCUMENTS

| | | | |
|---|---|---|---|
| 6,100,173 A | | 8/2000 | Gardner et al. |
| 6,165,826 A | * | 12/2000 | Chau et al. .................. 438/231 |
| 6,277,683 B1 | * | 8/2001 | Pradeep et al. ............. 438/200 |
| 6,524,939 B1 | | 2/2003 | Tseng |
| 6,528,402 B1 | | 3/2003 | Tseng |
| 6,534,405 B1 | | 3/2003 | Wu |
| 6,562,718 B1 | | 5/2003 | Xiang et al. |
| 6,589,836 B1 | | 7/2003 | Wang et al. |
| 6,787,464 B1 | * | 9/2004 | Cheek et al. ............... 438/683 |
| 2002/0119632 A1 | | 8/2002 | Tseng |

OTHER PUBLICATIONS

U.S. Appl. No. 10/904,885 filed Dec. 2, 2004, entitled "Method for Forming Self-Aligned Dual Fully Silicided Gates In CMOS".
U.S. Appl. No. 10/890,753 filed Jul. 14, 2004, entitled "Formation of Fully Silicided Metal Gate Using Dual Self-Aligned Silicide Process".
U.S. Appl. No. 10/725,851 filed Dec. 2, 2003, entitled "Method For Integration of Silicide Contacts And Silicide Gate Metals".

* cited by examiner

*Primary Examiner*—Michelle Estrada
(74) *Attorney, Agent, or Firm*—Gibb I.P. Law Firm, LLC; James J. Cioffi, Esq.

(57) ABSTRACT

A method of fabricating a complementary metal oxide semiconductor (CMOS) device, wherein the method comprises forming a first well region in a semiconductor substrate for accommodation of a first type semiconductor device; forming a second well region in the semiconductor substrate for accommodation of a second type semiconductor device; shielding the first type semiconductor device with a mask; depositing a first metal layer over the second type semiconductor device; performing a first salicide formation on the second type semiconductor device; removing the mask; depositing a second metal layer over the first and second type semiconductor devices; and performing a second salicide formation on the first type semiconductor device. The method requires only one pattern level and it eliminates pattern overlay as it also simplifies the processes to form different silicide material over different devices.

21 Claims, 18 Drawing Sheets

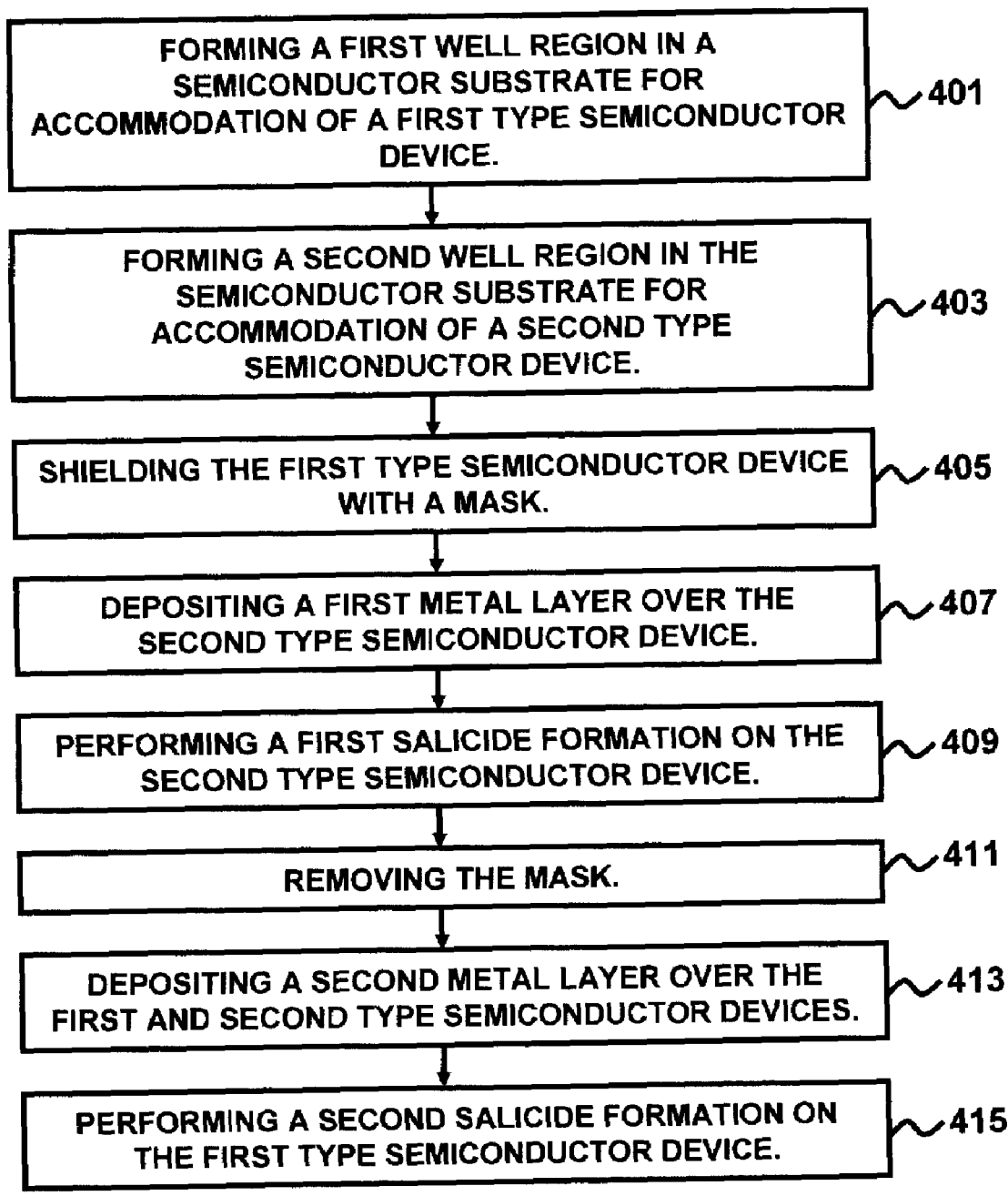

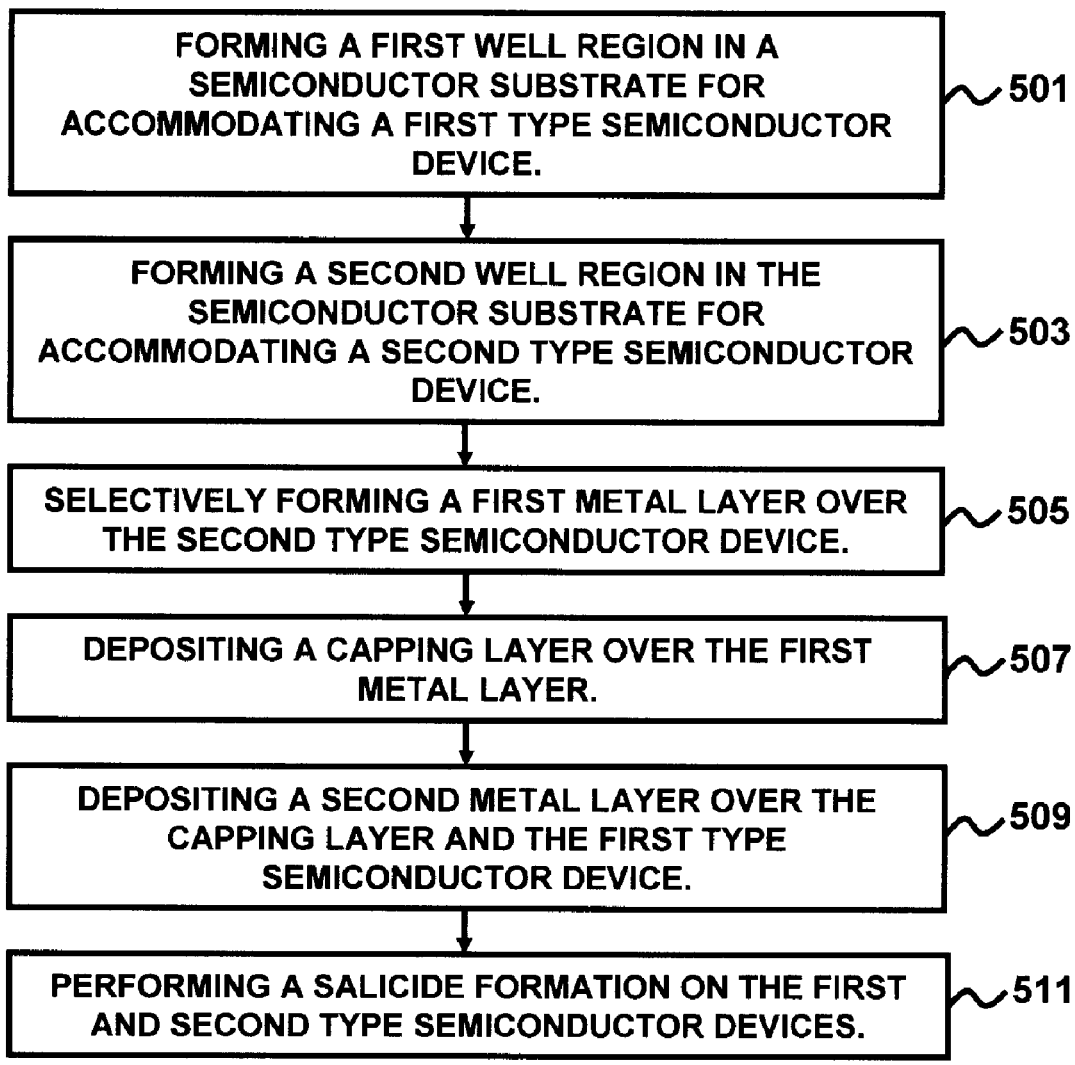

US 7,064,025 B1

METHOD FOR FORMING SELF-ALIGNED DUAL SALICIDE IN CMOS TECHNOLOGIES

CROSS REFERENCE TO RELATED APPLICATION

This application relates to co-pending U.S. patent application entitled "Method for Forming Self-Aligned Dual Fully Silicide Gates in CMOS Devices" U.S. Ser. No. 10/904,885, filed Dec. 2, 2004, the contents of which in its entirety is herein incorporated by reference.

FIELD OF THE INVENTION

The embodiments of the invention generally relate to complementary metal oxide semiconductor (CMOS) device fabrication, and more particularly to a method of forming dual self-aligned silicide in CMOS technologies to improve device performance.

DESCRIPTION OF THE RELATED ART

The term salicide, which stands for Self-ALIgned siliCIDE, refers to a silicide formed by a self-aligning method. A salicide is typically formed by depositing a metal layer (such as Ti, Co, Ni, etc.) over a silicon layer, and then annealing the semiconductor structure. Where the metal is in contact with the exposed silicon or polysilicon, a silicide is formed. Un-reacted metal is then selectively etched away, leaving the silicide automatically aligned to the underlying conductive gate (commonly polysilicon) and source/drain structure. The terms "silicide" and "salicide" are used interchangeably herein. Salicide processes are commonly implemented in MOS (metal oxide semiconductor) and CMOS processes to reduce contact resistance and sheet resistance.

FIG. 1 illustrates a conventional CMOS device 51 having the same silicide on each side (NFET (N-type field effect transistor) 80 and PFET (P-type field effect transistor) 70 side) of the device 51. The CMOS device 51 consists of a substrate 52 with Nwell (N-type retrograde well) and Pwell (P-type retrograde well) regions 53, 54, respectively configured therein. Shallow trench isolation regions 55 are also included in the CMOS device 51. The NFET portion 80 of the CMOS device 51 comprises a NFET gate 58 capped by a silicide layer 60. Additionally, insulative sidewall spacers 59 are configured around the NFET gate 58. A NFET gate dielectric 57 is positioned below the NFET gate 58. Moreover, NFET source/drain implant regions 68 comprising NFET source/drain silicide contacts 56 are also formed in the Pwell region 54 on opposite sides of the NFET gate 58. Likewise, the PFET portion 70 of the CMOS device 51 comprises a PFET gate 63 capped by a silicide layer 67. Additionally, insulative sidewall spacers 61 are configured around the PFET gate 63. A PFET gate dielectric 62 is positioned below the PFET gate 63. Additionally, PFET source/drain implant regions 69 comprising PFET source/drain silicide contacts 66 are also formed in the Nwell region 53 on opposite sides of the PFET gate 63. As indicated by the uniform hatching designation in FIG. 1, the NFET source/drain silicide 56, NFET gate silicide layer 60, PFET source/drain silicide 66, and PFET gate silicide layer 67 all comprise the same silicide material.

However, one of the drawbacks of this approach is non-optimal device performance when compared with a dual salicide approach. In fact, the performance of the NFET and PFET regions in a CMOS device could be optimized by applying different kinds of silicide (dual salicide process) in the respective NFET and PFET areas (for the source/drain and gate areas).

FIGS. 2 through 4 illustrate iterative steps of forming a conventional dual salicide CMOS device 1 (i.e., a CMOS device 1 formed of two different silicide materials). Generally, as illustrated in FIG. 2, the dual salicide process involves depositing a first silicide block film (such as oxide or nitride film) 14 over the entire device 1. Then, a first lithographic pattern and etching process is performed to remove a portion of the blocking film 14 over the NFET region 40 of the device 1. The NFET region 40 consists of a Pwell 4 formed in a substrate 2 with NFET source/drain implant regions 18 formed in the Pwell 4, a NFET gate dielectric 7 formed over the Pwell 4, and with a NFET gate 8 formed over the gate dielectric 7. A pair of insulative sidewalls 9 is also formed around the NFET gate 8. Additionally, shallow trench isolation regions 5 are also included in the CMOS device 1. The remaining portion of the film 14 protects the PFET region 30 of the device 1. The PFET region 30 is similarly configured to the NFET region 40, wherein the PFET region 30 consists of a Nwell 3 formed in the substrate 2 with PFET source/drain implant regions 19 formed in the Nwell 3, with a PFET gate dielectric 12 formed over the Nwell 3, and with a PFET gate 13 formed over the PFET gate dielectric 12. A pair of insulative sidewalls 11 is formed around the PFET gate 13 as well. A salicide process is performed over the NFET region 40 to form a silicide layer 10 over the NFET gate 8 as well as forming NFET source/drain silicide contacts 6.

Next, as shown in FIG. 3, the first blocking film 14 is removed from the device 1, and a second silicide blocking film (such as oxide or nitride film) 15 is deposited over the entire device 1. Then, a second lithographic pattern and etching process is performed to remove a portion of the blocking film 15 over the PFET region 30 of the device 1. Thereafter, a salicide process is performed over the PFET region 30 to form a silicide layer 17 over the PFET gate 13 as well as forming a PFET source/drain silicide contacts 16. As shown in FIG. 4, the silicide on the NFET portion 40 of the device 1 is different from the silicide on the PFET portion 30 of the device 1.

However, one of the problems with the conventional two lithography level dual salicide process as provided in FIGS. 2–4 is the misalignment caused during the processing between the two lithography levels as illustrated in FIG. 5 (the dotted circle represents the area of the device 1 where the misalignment occurs). This misalignment between the NFET region 40 and PFET region 30 results in an underlay in the device 1 (illustrated in FIG. 5 as a SRAM (synchronous random access memory) cell layout), which can cause high sheet resistance or an open circuit in the device and/or circuit areas thereby resulting in inferior device/circuit performance. Therefore, there remains a need for a novel dual salicide process, which overcomes this misalignment problem.

SUMMARY OF THE INVENTION

In view of the foregoing, an embodiment of the invention provides a method of fabricating a CMOS device, wherein the method comprises forming a first well region in a semiconductor substrate for accommodation of a first type semiconductor device; forming a second well region in the semiconductor substrate for accommodation of a second type semiconductor device; shielding the first type semiconductor device with a mask; depositing a first metal layer over the second type semiconductor device; performing a first salicide formation on the second type semiconductor device; removing the mask; depositing a second metal layer over the first and second type semiconductor devices; and performing a second salicide formation on the first type semiconductor device. The method further comprises removing the second metal layer from the second type semiconductor device. In a first embodiment, the first well region is configured as a NFET well region and the second well region is configured as a PFET well region. In a second embodiment, the first well region is configured as a PFET well region and the second well region is configured as a NFET well region.

Additionally, the first metal layer is formed of different materials than the second metal layer. Furthermore, the first type semiconductor device is formed by configuring an insulator layer over the first well region; configuring a gate region over the insulator layer; forming insulative spacers on opposite sides of the gate region; and implanting source/drain regions in the first well region. Moreover, the second type semiconductor device is formed by configuring an insulator layer over the second well region; configuring a gate region over the insulator layer; forming insulative spacers on opposite sides of the gate region; and implanting source/drain regions in the second well region. The method further comprises forming a cap layer over each of the first metal layer and the second metal layer, wherein the cap layer comprises any of TiN, Ti, and TaN, and wherein the first metal layer and second metal layer comprises any of Ti, Co, Ni, Pt, Re, W, Pd, Ta, Nb, and their alloys.

Another aspect of the invention provides a method of forming an integrated circuit on a semiconductor substrate, wherein the method comprises forming each of a first and second type semiconductor device on the semiconductor substrate; depositing a first metal layer over the second type semiconductor device; performing a first salicide formation on only the second type semiconductor device; depositing a second metal layer over both the first and second type semiconductor device; and performing a second salicide formation on only the first type semiconductor device. The method further comprises shielding the first type semiconductor device with a mask prior to deposition of the first metal layer and removing the mask after performing the first salicide formation. Additionally, the method further comprises removing the second metal layer from the second type semiconductor device. Moreover, the first metal layer is formed of different materials than the second metal layer. Furthermore, the first type semiconductor device is formed by configuring an insulator layer over a first well region; configuring a gate region over the insulator layer; forming insulative spacers on opposite sides of the gate region; and implanting source/drain regions in the first well region.

Additionally, according to a first embodiment, the first well region is configured as any of a NFET well region and a PFET well region. Also, the second type semiconductor device is formed by configuring an insulator layer over a second well region; configuring a gate region over the insulator layer; forming insulative spacers on opposite sides of the gate region; and implanting source/drain regions in the second well region. According to a second embodiment, the second well region is configured as any of a NFET well region and a PFET well region. The method further comprises forming a cap layer over each of the first metal layer and the second metal layer, wherein the cap layer comprises any of TiN, Ti, and TaN, and wherein the first metal layer and second metal layer comprises any of Ti, Co, Ni, Pt, Re, W, Pd, Ta, Nb, and their alloys.

Another embodiment of the invention provides a method of forming metal silicide layers over a semiconductor substrate, wherein the method comprises forming a first well region in the semiconductor substrate for accommodating a first type semiconductor device; forming a second well region in the semiconductor substrate for accommodating a second type semiconductor device; selectively forming a first metal layer over the second type semiconductor device; depositing a capping layer over the first metal layer; depositing a second metal layer over the capping layer and the first type semiconductor device; and performing a salicide formation on the first and second type semiconductor devices, wherein the performing of the silicide formation on the first and second type semiconductor devices is accomplished by annealing the first and second metal layers; removing the capping layer; and removing un-reacted metal from the first and second type semiconductor devices. In a first embodiment, the first well region is configured as a NFET well region and the second well region is configured as a PFET well region. In a second embodiment, the first well region is configured as a PFET well region and the second well region is configured as a NFET well region. Moreover, the first metal layer is formed of different materials than the second metal layer.

Additionally, the first type semiconductor device is formed by configuring an insulator layer over the first well region; configuring a gate region over the insulator layer; forming insulative spacers on opposite sides of the gate region; and implanting source/drain regions in the first well region. Furthermore, the second type semiconductor device is formed by configuring an insulator layer over the second well region; configuring a gate region over the insulator layer; forming insulative spacers on opposite sides of the gate region; and implanting source/drain regions in the second well region. The method further comprises forming a second capping layer over the second metal layer prior to the process of performing the salicide formation, wherein the capping layer and the second capping layer comprises any of TiN, Ti, and TaN, and wherein the first metal layer and second metal layer comprises any of Ti, Co, Ni, Pt, Re, W, Pd, Ta, Nb, and their alloys.

Generally, the embodiments of the invention provide a double self-aligning technique of forming a dual salicide (i.e., different salicide formations), such as NiSi, $CoSi_2$, $TiSi_2$, $WSi_2$, PdSi, PtSi, $TaSi_2$, ReSi, etc., and their alloys at the source/drain and gate areas for NFET and PFET regions of a CMOS device with only one lithography level. As such, the embodiments of the invention reduce the required lithography level, greatly simplify the dual salicide formation process, and eliminate the misalignment problem associated with some conventional techniques. Moreover, the embodiments of the invention enable the optimization of the performance of the CMOS device by forming one salicide in the NFET region and a different salicide in the PFET region.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 17 is a flow diagram illustrating a preferred method according to the first embodiment of the invention; and FIG. 18 is a flow diagram illustrating a preferred method according to the second embodiment of the invention.

DETAILED DESCRIPTION OF PREFERRED EMBODIMENTS OF THE INVENTION

Figure 1:
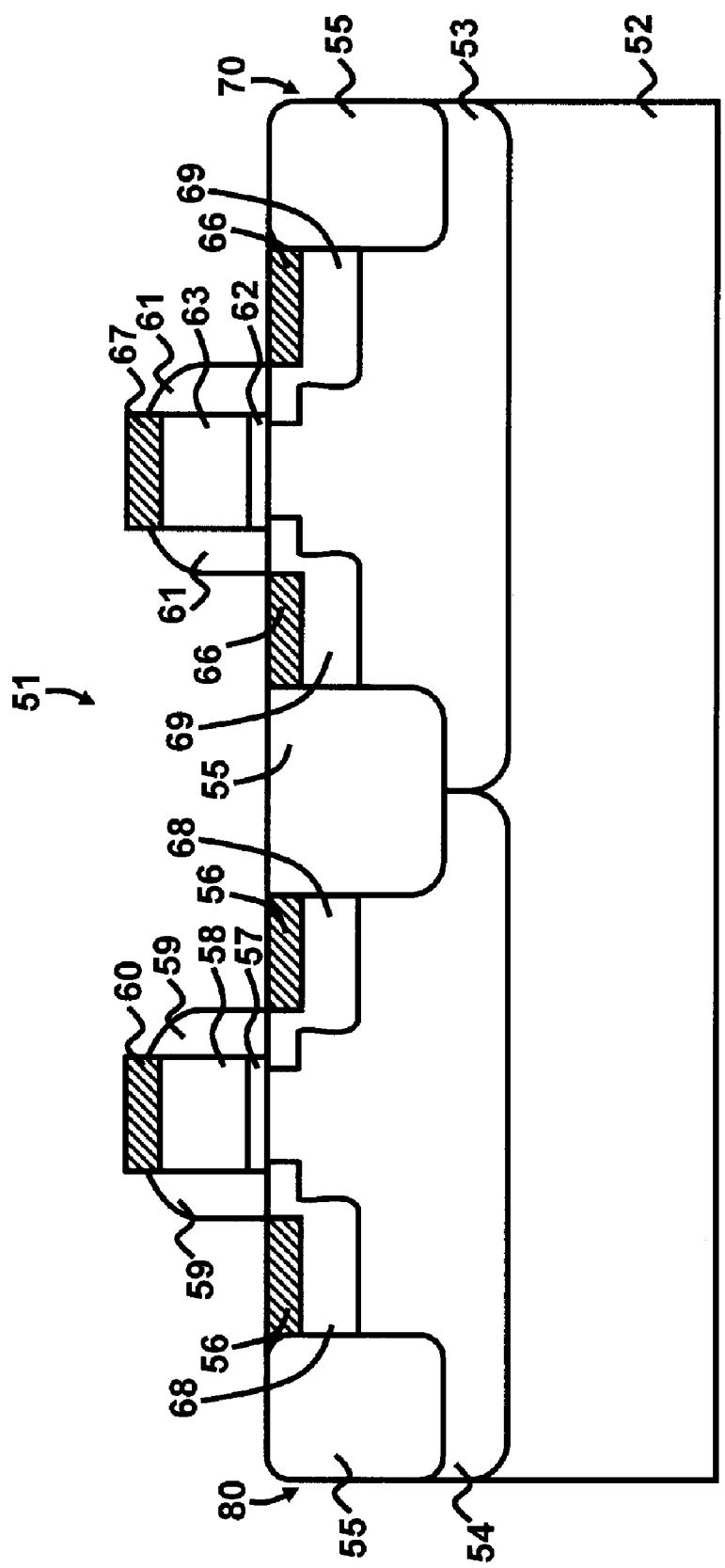
FIG. 1 is a schematic diagram illustrating a conventional salicide CMOS device with the same silicide on each side of the device.
Figure 2:
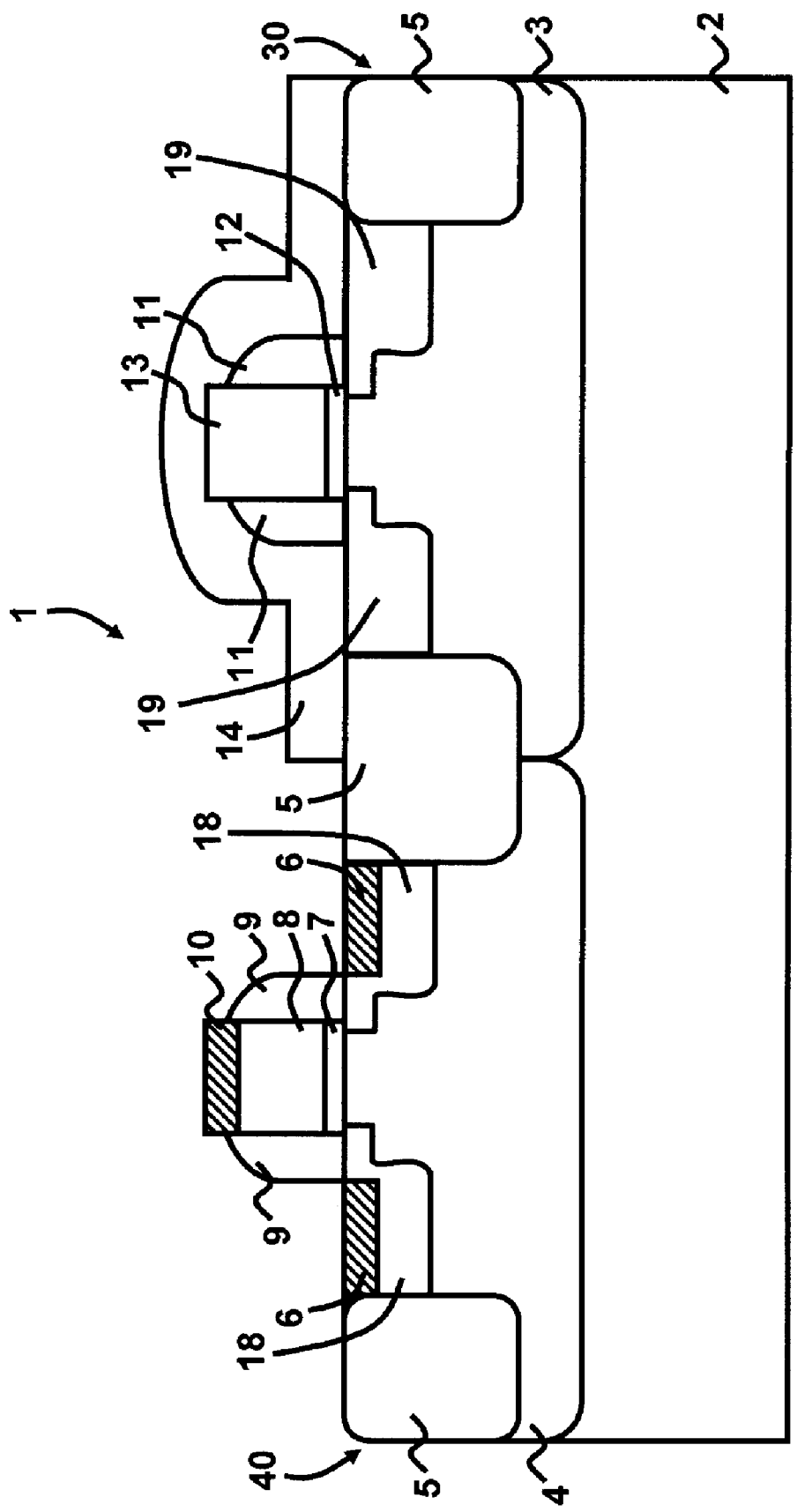
FIGS. 2 through 4 are schematic diagrams illustrating iterative steps of fabricating a conventional dual salicide CMOS device.
Figure 3:
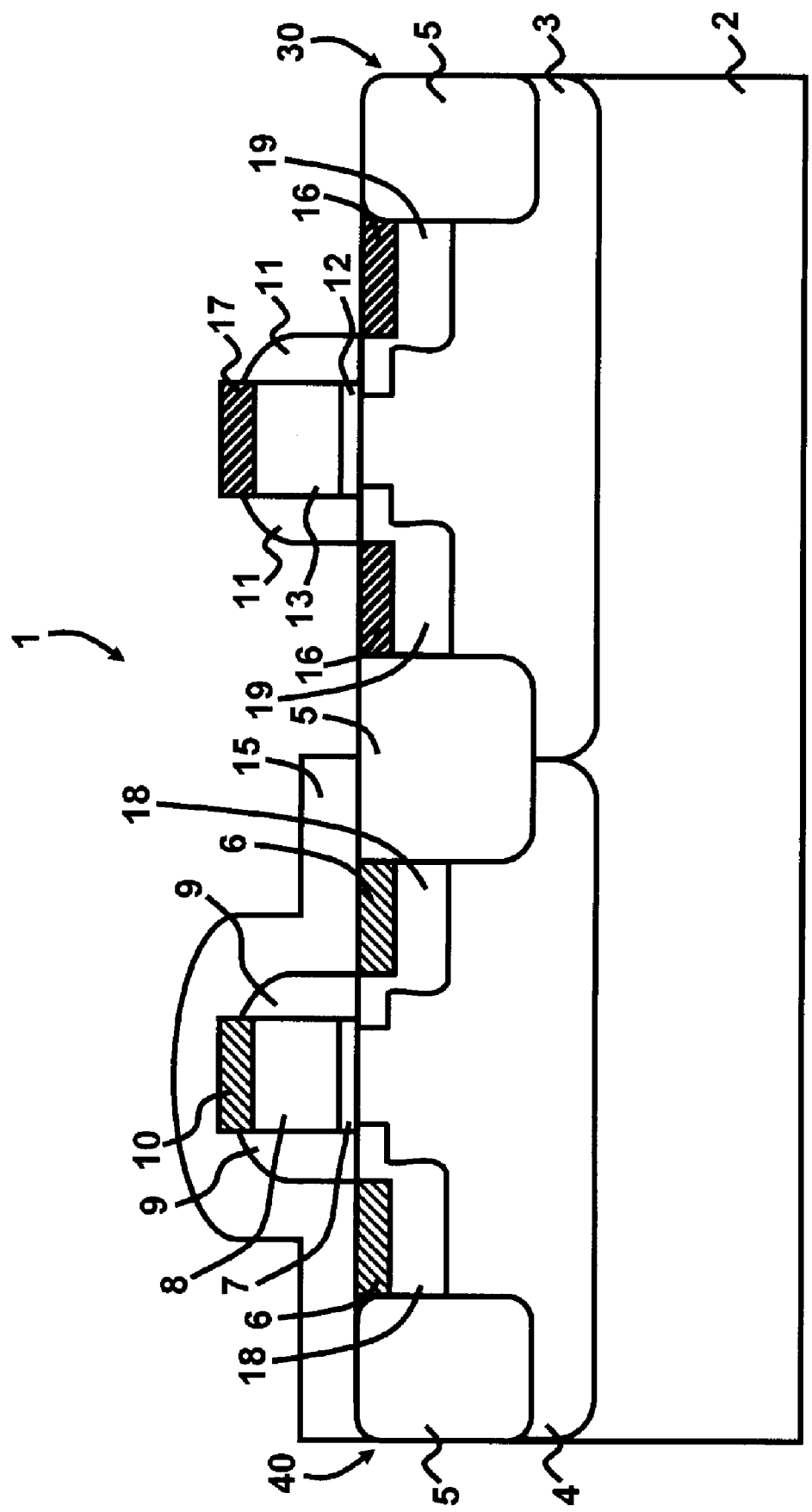
Figure 4:
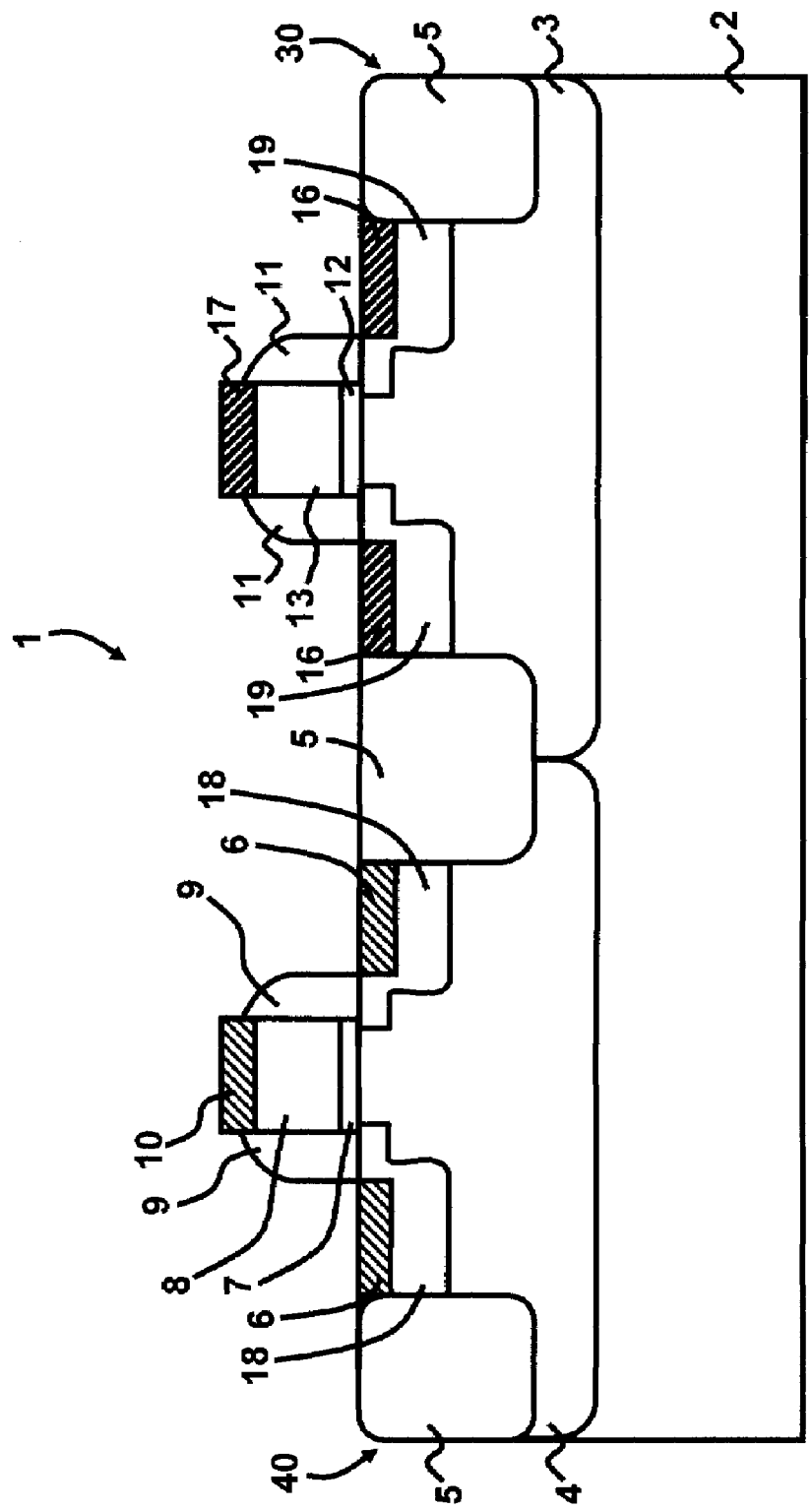
Figure 5:
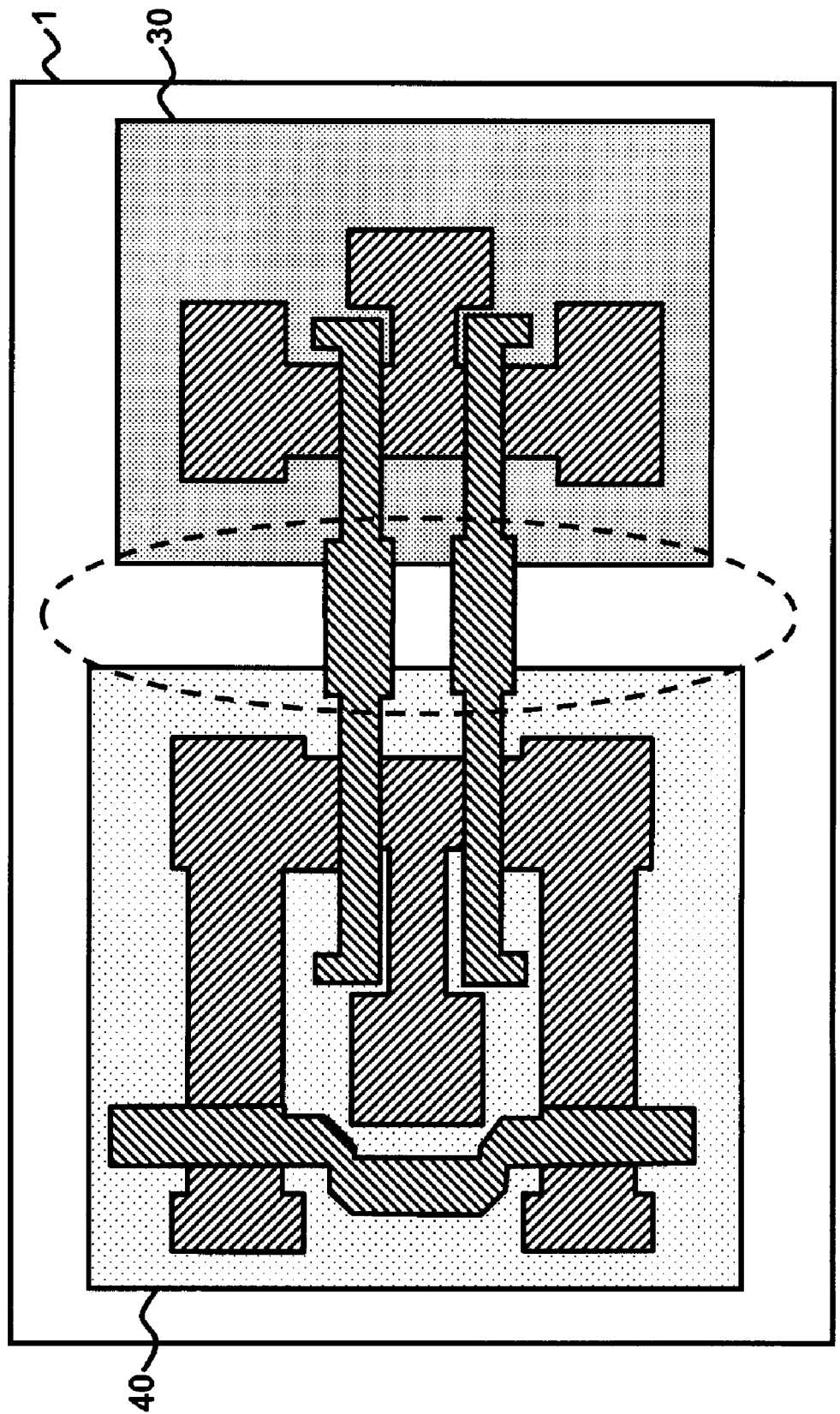
FIG. 5 is a schematic diagram illustrating a conventional SRAM cell layout of a CMOS device.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel dual salicide process, which overcomes the misalignment problem typical in conventional dual salicide processing. The embodiments of the invention achieve this need by providing simplified manufacturing methods to form different silicide material over different devices, which require only one pattern level thereby eliminating pattern overlay. Referring now to the drawings and more particularly to FIGS. 6 through 18 where similar reference characters denote corresponding features consistently throughout the figures, there are shown preferred embodiments of the invention.

Figure 6:
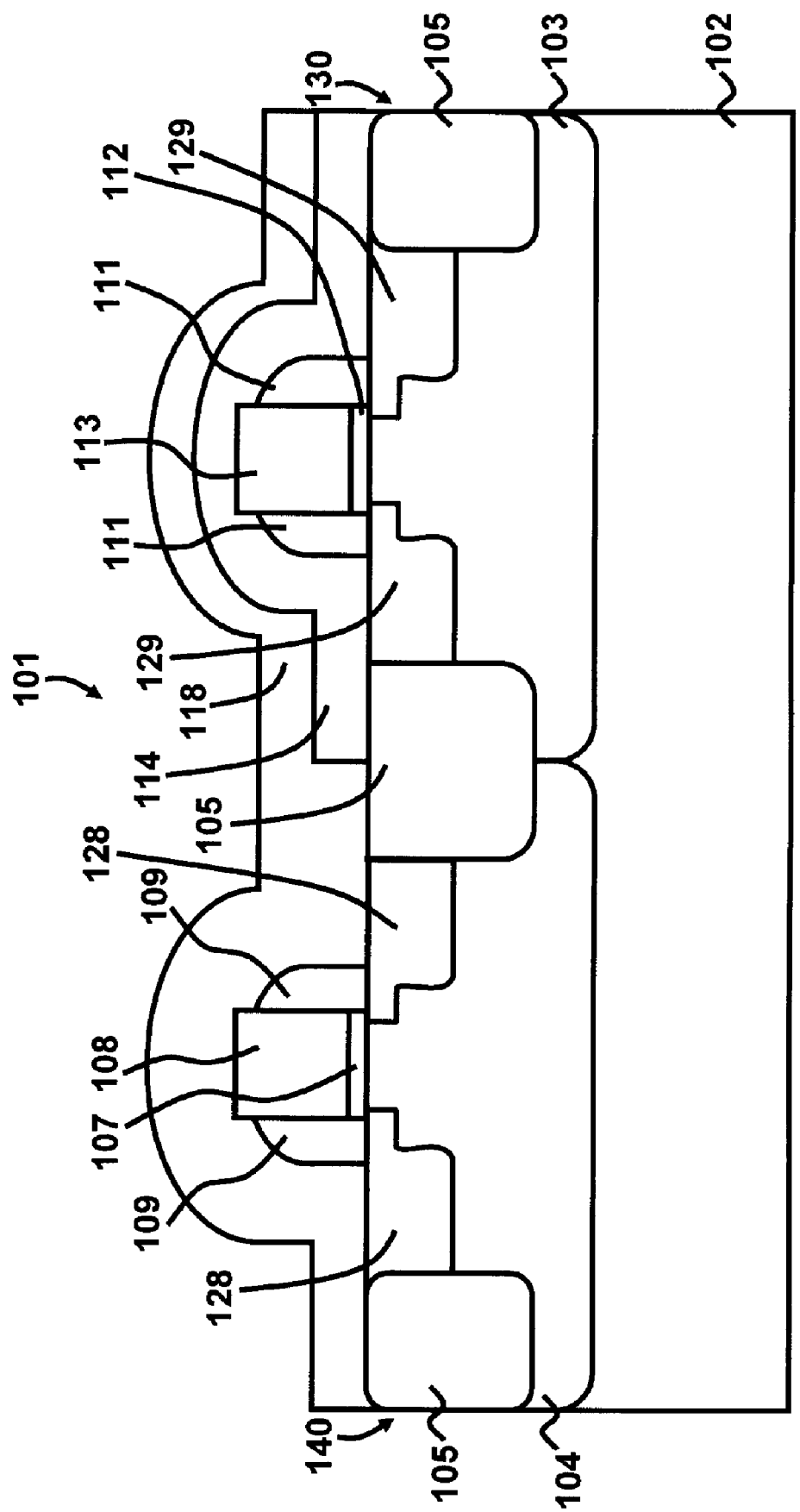
FIGS. 6 through 9 are schematic diagrams illustrating iterative steps of fabricating a dual salicide CMOS device according to a first embodiment of the invention.

FIGS. 6 through 9 illustrate iterative steps of fabricating a dual salicide CMOS device 101 according to a first embodiment of the invention. As illustrated in FIG. 6, the dual salicide process according to the first embodiment of the invention involves depositing a first silicide block film (for example, oxide, nitride, or TiN film) 114 over the entire device 101. Then, a first (and only) lithographic pattern and etching process is performed to remove a portion of the blocking film 114 over the NFET region 140 of the device 101. The NFET region 140 comprises a Pwell 104 formed in a substrate 102 with NFET source/drain implant regions 128 formed in the Pwell 104, with a NFET gate dielectric 107 formed over the Pwell 104, and with a NFET gate 108 formed over the gate dielectric 107. A pair of insulative sidewalls 109 is also formed around the NFET gate 108. Additionally, shallow trench isolation regions 105 are also included in the CMOS device 101 to provide electrical isolation between various devices in the CMOS device 101. A first metal layer 118 is then deposited over the device 101. Optionally, a cap layer (not shown) may be formed over the first metal layer 118 to prevent oxidation of the silicide during the subsequent annealing process. Furthermore, those skilled in the art would readily understand how to incorporate the optional capping layer over the first metal layer 118.

Figure 7:
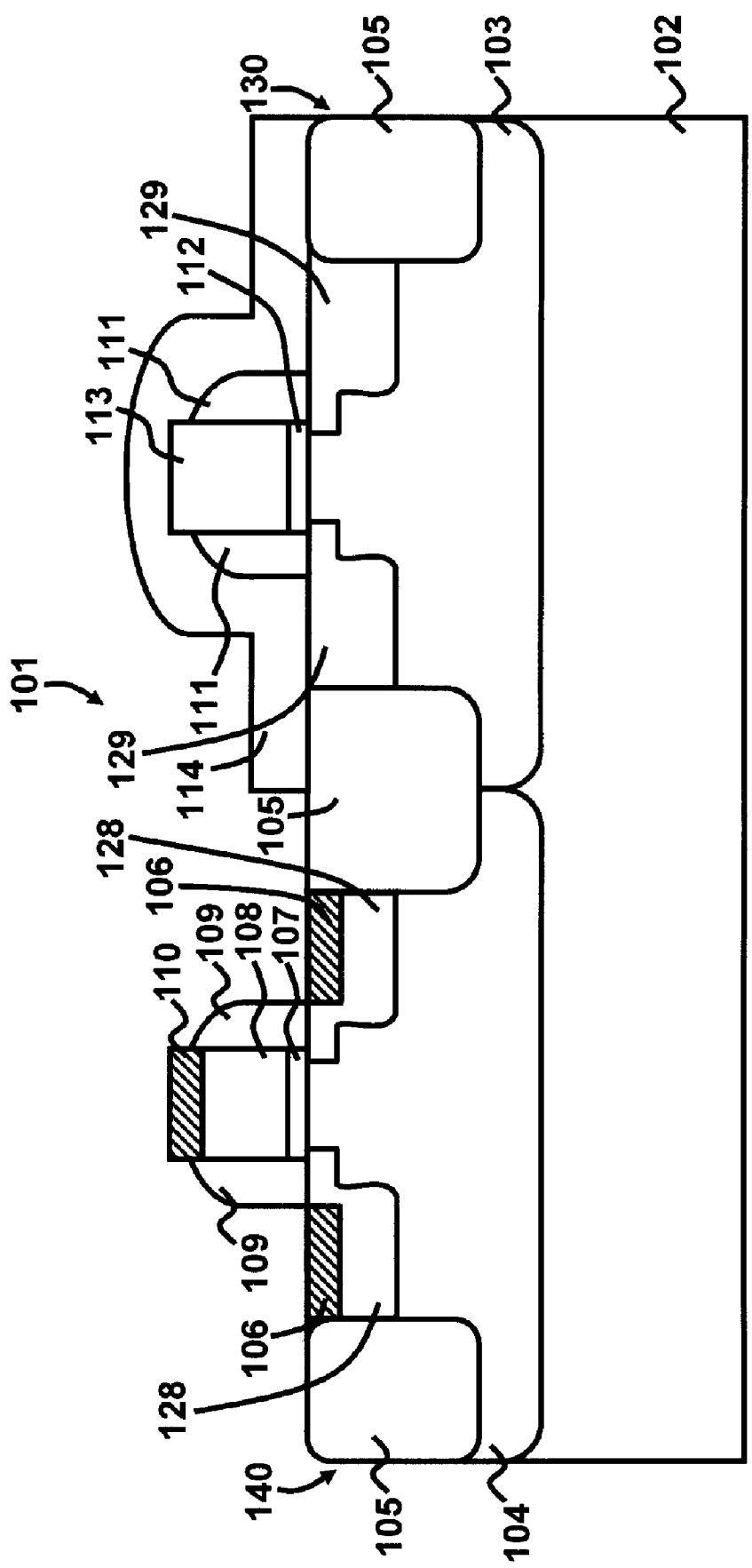

In one embodiment, the substrate 102 comprises a single-crystal silicon layer. Alternatively, the substrate 102 may comprise any appropriate semiconducting material, including, but not limited silicon (Si), germanium (Ge), gallium phosphide (GaP), indium arsenide (InAs), indium phosphide (InP), silicon germanium (SiGe), gallium arsenide (GaAs), or other semiconductors. The remaining portion of the film 114 protects the PFET region 30 of the device 1. The PFET region 130 is similarly configured to the NFET region 140, wherein the PFET region 130 includes a Nwell 103 formed in the substrate 102 with PFET source/drain implant regions 129 formed in the Nwell 103, with a PFET gate dielectric 112 formed over the Nwell 103, and with a PFET gate 113 formed over the PFET gate dielectric 112. A pair of insulative sidewalls 111 is formed around the PFET gate 113 as well. Moreover, the retrograde well regions (Pwell 104 and Nwell 103) may be formed using any well-known technique such as high-energy ion implantation and annealing. A salicide process is performed over the NFET region 140 to form a silicide layer 110 over the NFET gate 108 as well as forming a NFET source/drain silicide contacts 106 as shown in FIG. 7.

Figure 8:
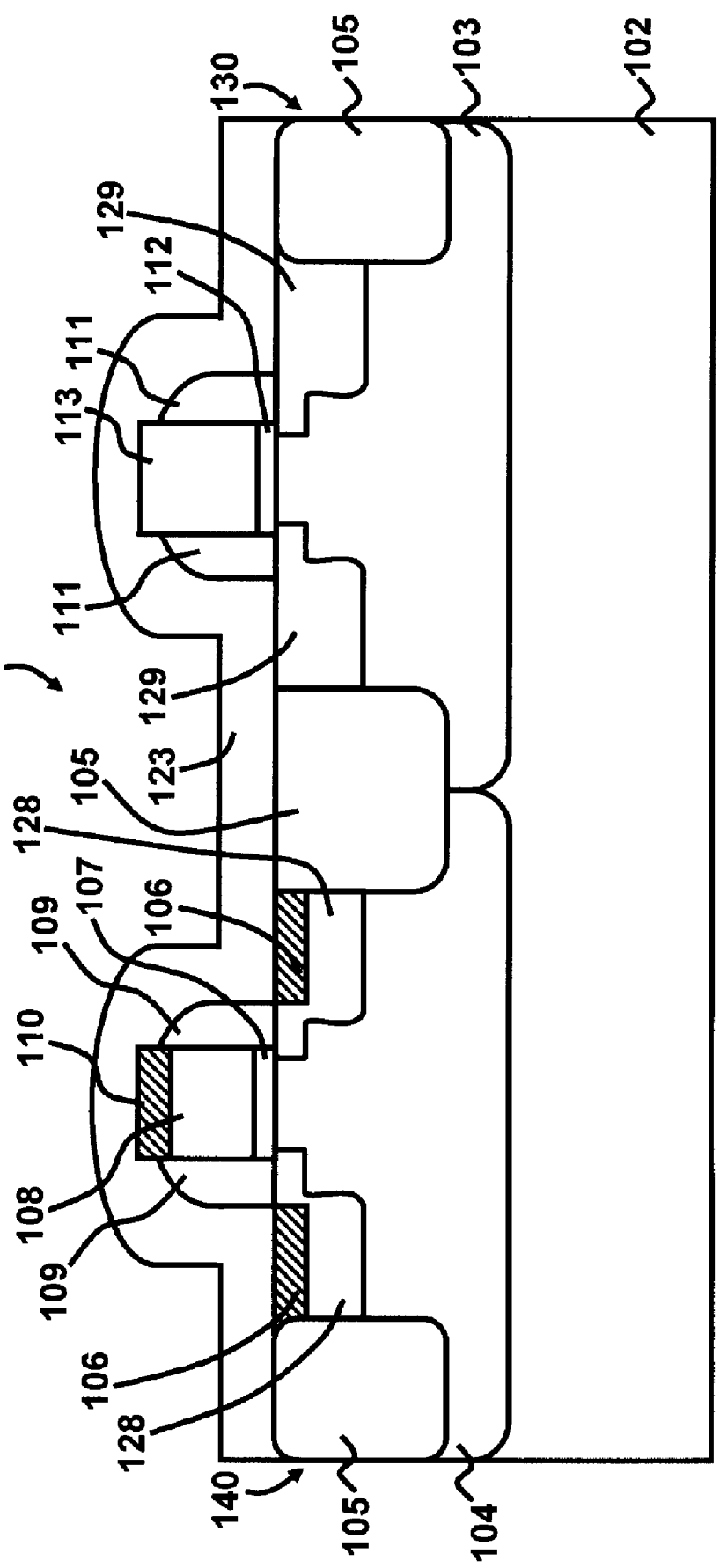
Figure 9:
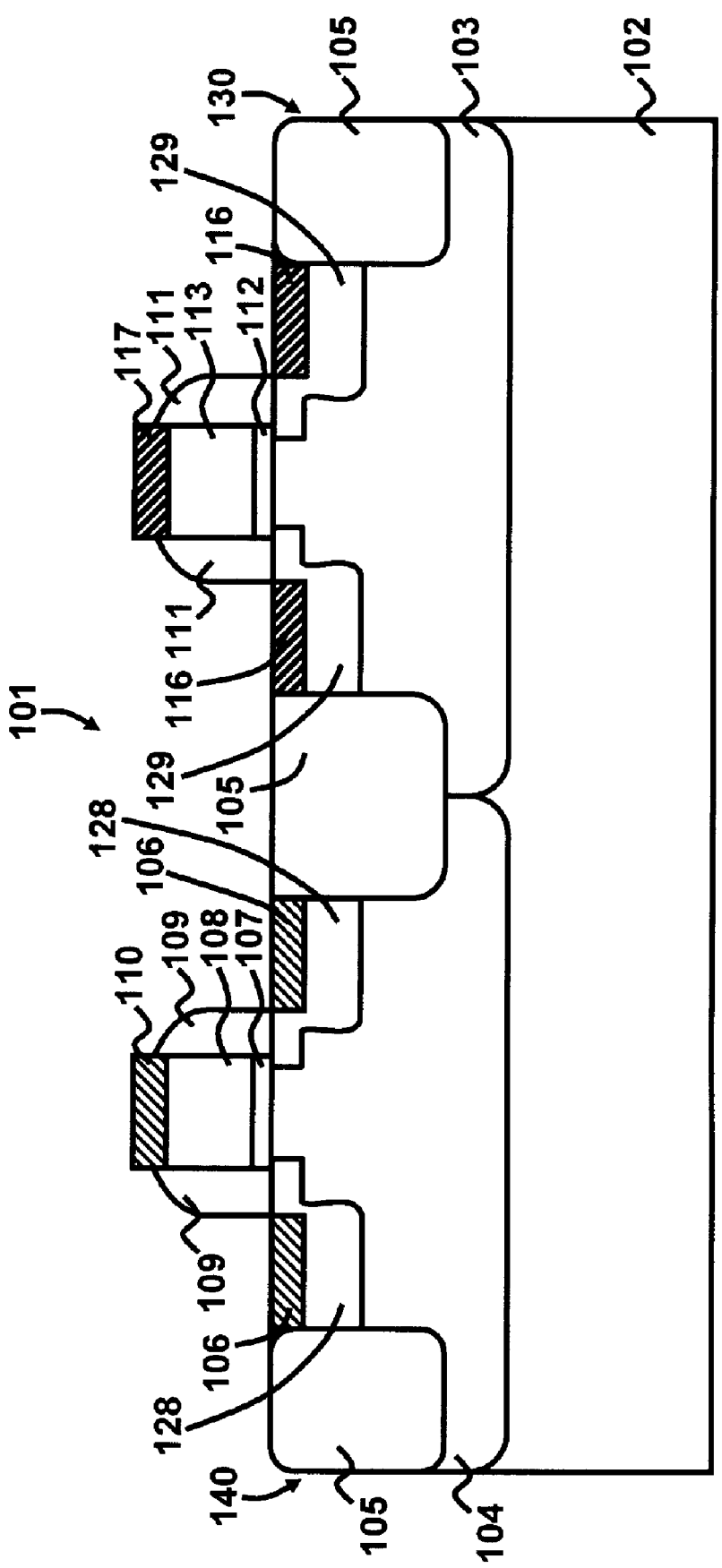

Next, as illustrated in FIG. 8, the silicide blocking film 114 is removed from the device 101, and a second metal layer 123 is deposited over the entire device 101 (i.e., over both the NFET 140 and PFET 130 regions). Optionally, a cap layer (not shown) may be formed over the second metal layer 123 to prevent oxidation of the silicide during the subsequent annealing process. Furthermore, those skilled in the art would readily understand how to incorporate the optional capping layer over the second metal layer 123. Thereafter, as depicted in FIG. 9, after an annealing process is conducted, the resulting silicide layer 117 over the PFET gate 113 as well as the source/drain silicide contacts 116 on opposite sides of the PFET gate 113 is formed. As shown in FIG. 9, the silicide on the NFET portion 140 of the device 101 is different from the silicide on the PFET portion 130 of the device 101. Moreover, the dual salicide process provided by the first embodiment of the invention is performed with only one lithography patterning and etching process having to be performed on the silicide blocking film 1114. As such, a second blocking film is unnecessary, which is contrary to the conventional approaches, thus there is no need for a second patterning process. Moreover, because there is only one patterning process needed, there is no misalignment problem, thereby overcoming the aforementioned misalignment problem often found in conventional devices.

While the above description and accompanying drawings indicate that the NFET region 140 undergoes the salicide process first, the embodiments of the invention are not limited to such a sequence. Rather, the PFET region 130 could equally and just as optimally undergo the salicide process first, and the embodiments of the invention are not limited to any particular sequence. In fact, it is preferable to first form the silicide on the side (either NFET side 140 or PFET side 130) of the device 101 that requires a higher thermal budget. In this way, it can minimize the impact on first silicide during formation of the second silicide. In the contexts of the embodiments of the invention, the thermal budget may be lowered using rapid thermal processing (RTP).

Figure 10:
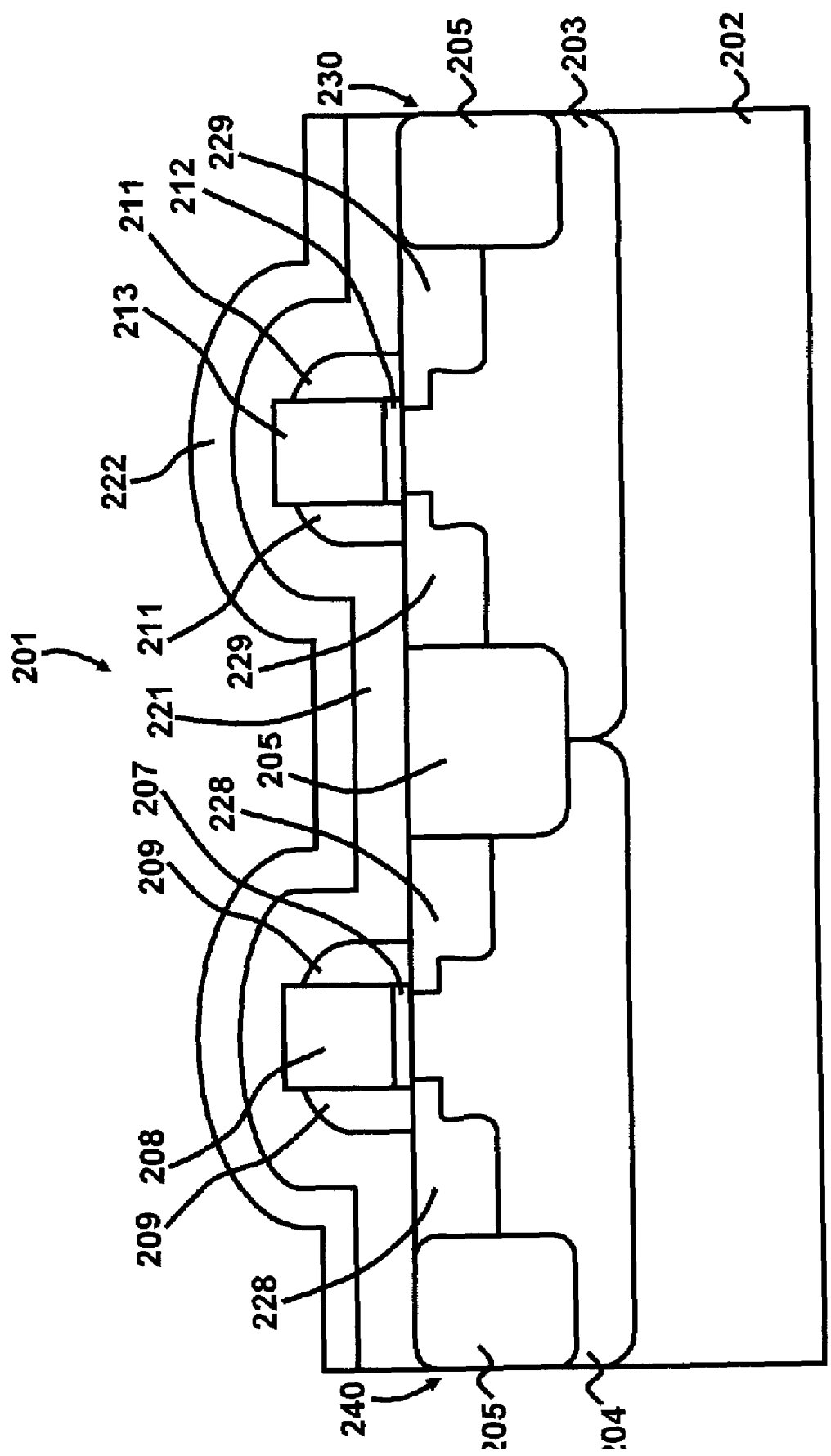
FIGS. 10 through 13 are schematic diagrams illustrating iterative steps of fabricating a dual salicide CMOS device according to a second embodiment of the invention.

FIGS. 10 through 13 illustrate iterative steps of fabricating a dual salicide CMOS device 201 according to a second embodiment of the invention, which is advantageous to use if both silicides (on both sides of the device) have a common silicidation temperature window. As illustrated in FIG. 10, the dual salicide process according to the second embodiment of the invention involves depositing a first metal layer 221 over the entire device 201. Then, a cap layer 222, such as TiN, is deposited over the first metal layer 221. The CMOS device 201 illustrated in FIG. 10 generally comprises a NFET region 240 and a PFET region 230, and more specifically comprises an Pwell 204 formed in a substrate 202 with NFET source/drain implant regions 228 formed in the Pwell 2044, with a NFET gate dielectric 207 formed over the Pwell 204, and with a NFET gate 208 formed over the gate dielectric 207. Likewise, the PFET region 230 includes a Nwell 203 formed in the substrate 202 with PFET source/drain implant regions 229 formed in the Nwell 203, with a PFET gate dielectric 212 formed over the Nwell 203, and with a PFET gate 213 formed over the PFET gate dielectric 212. A pair of insulative sidewalls 211 is formed around the PFET gate 213, and a pair of insulative sidewalls 209 is formed around the NFET gate 208 as well. Additionally, shallow trench isolation regions 205 are also included in the CMOS device 201 to provide electrical isolation between various devices in the CMOS device 201.

Figure 11:
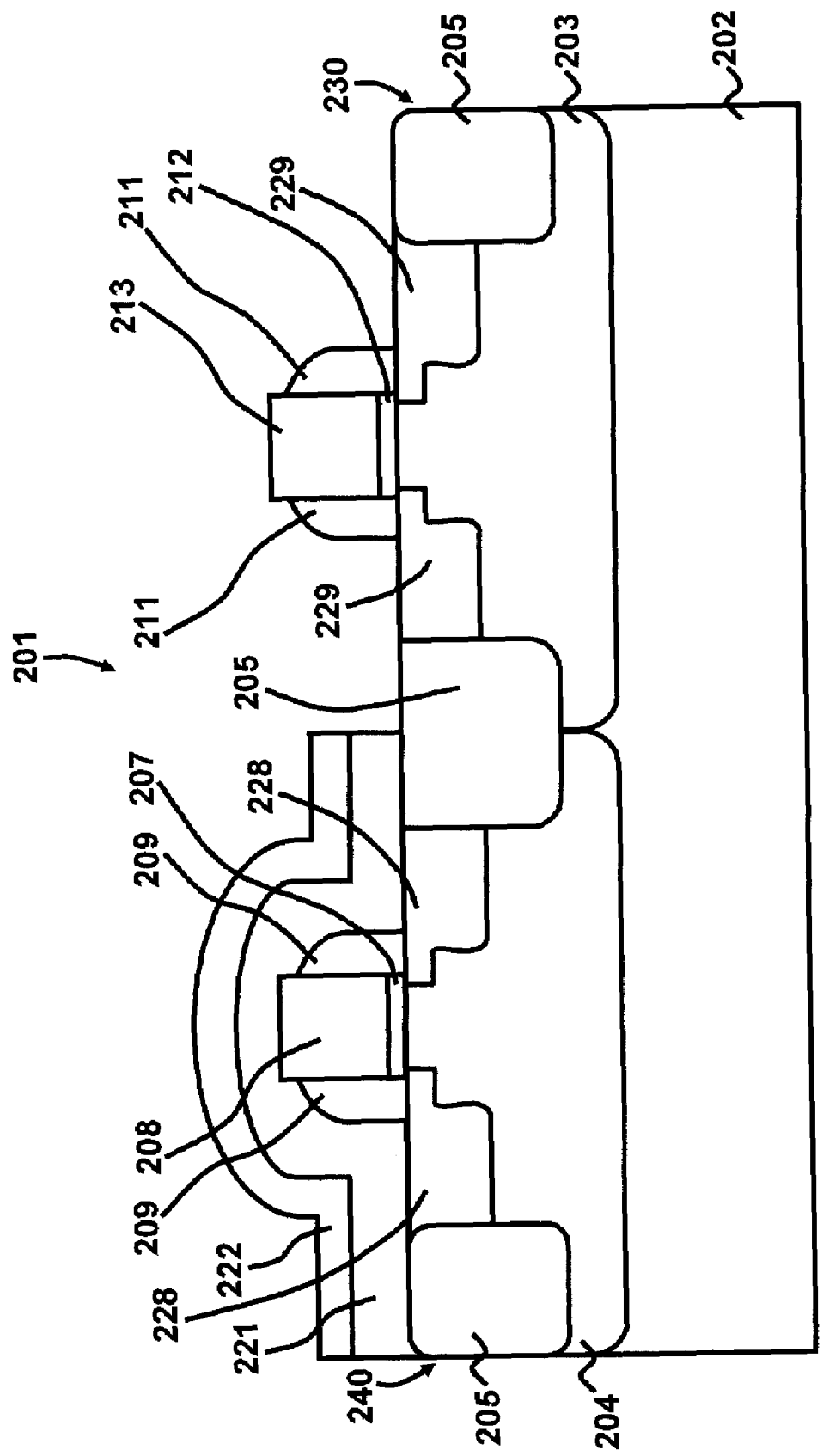
Figure 12:
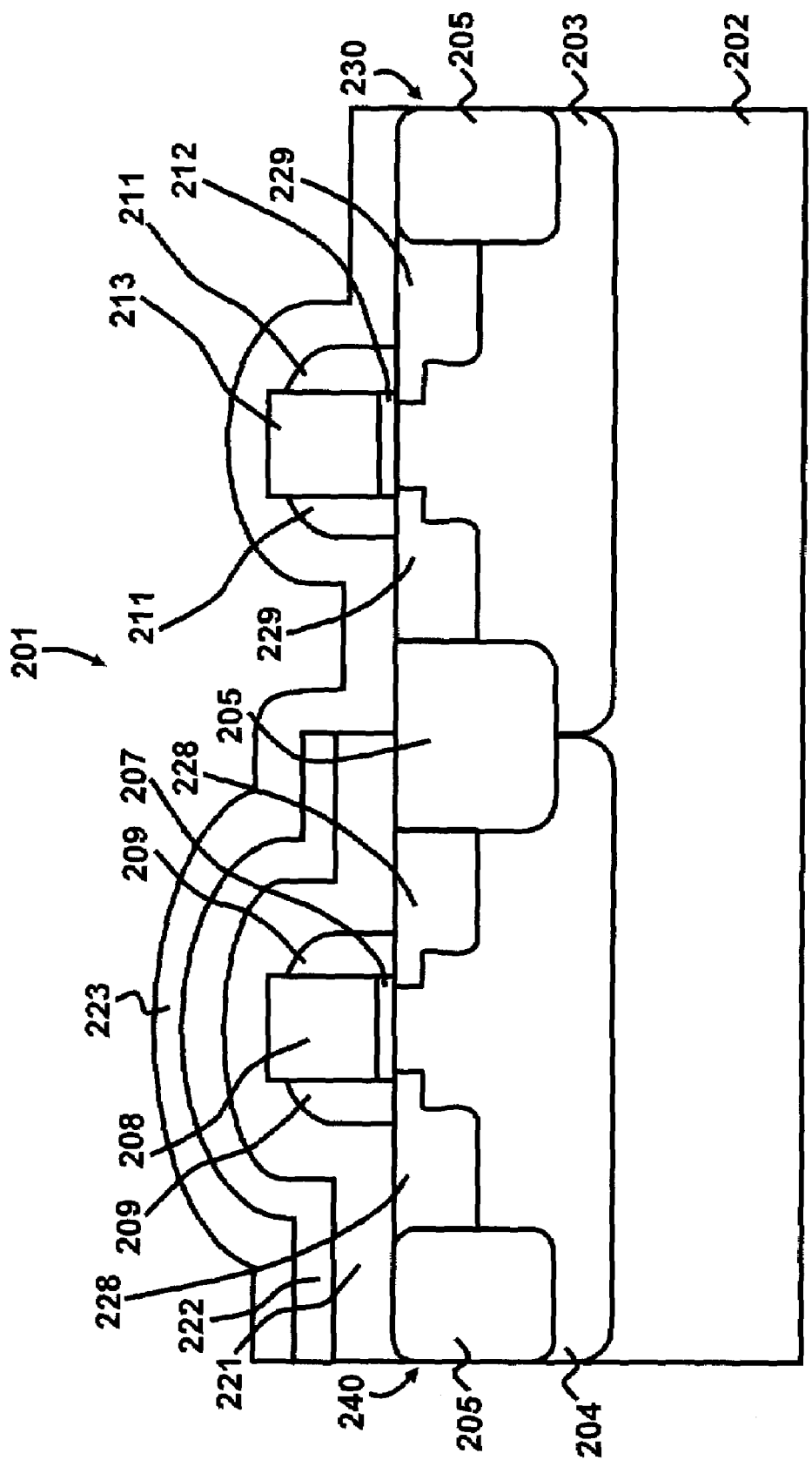

Then, as shown in FIG. 11, a first (and only) lithographic pattern and etching process (preferably an anisotropic dry etching process) is performed to remove a portion of the metal layer 221 and cap layer 222 over the PFET region 230 of the device 201. Next, as indicated in FIG. 12, a second metal layer 223 is deposited over the entire device 201. An additional cap layer (not shown) may be deposited over the second metal layer 223. The additional cap layer (not shown) could prevent oxidation of the silicide during the next step of the process, which involves annealing. Furthermore, those skilled in the art would readily understand how to incorporate the optional capping layer over the second metal layer 223.

Figure 13:
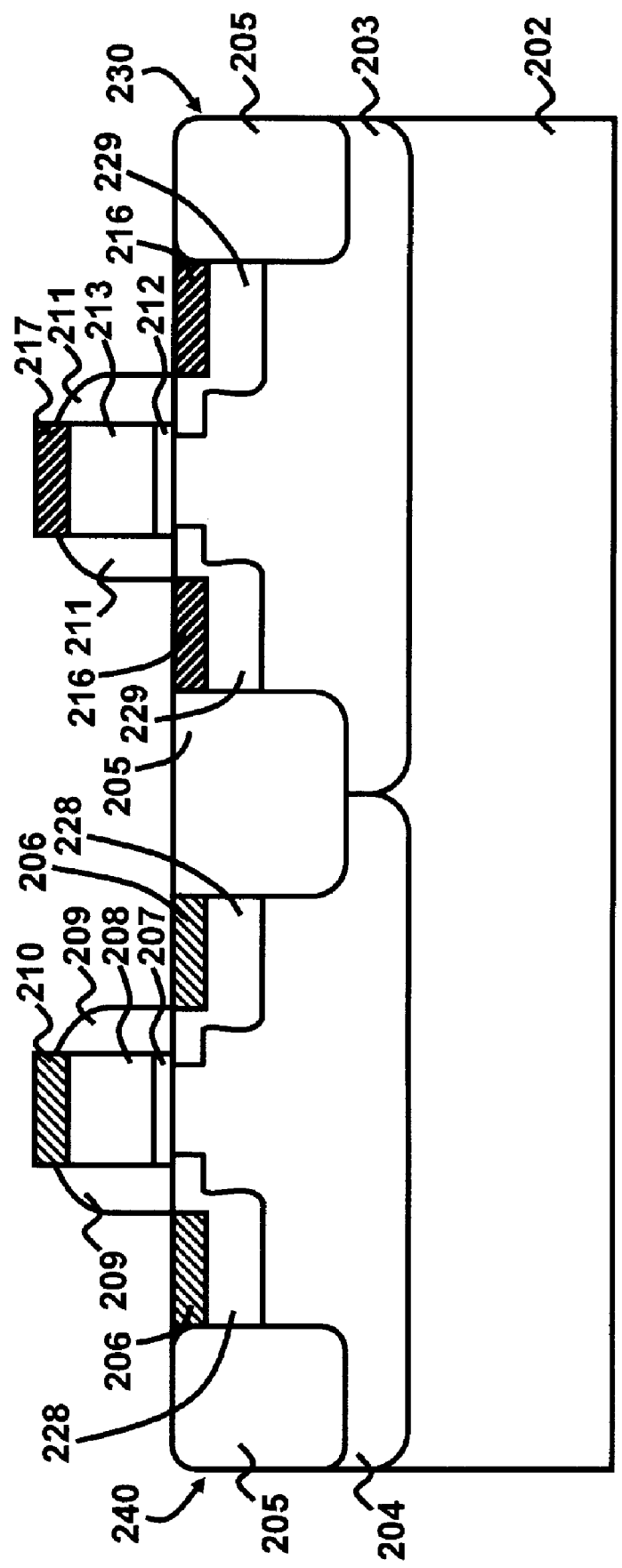

Next, as illustrated in FIG. 13, the annealing process is performed on form both silicides (i.e., the silicide in the NFET region 240 and the silicide in the PFET region 230) resulting in silicide layer 210 over the NFET gate 208, the silicide layer 217 over the PFET gate 213, as well as the source/drain silicide contacts 206 on opposite sides of the NFET gate 208 and source/drain silicide contacts 216 on opposite sides of the PFET gate 213. As shown in FIG. 13, the silicide on the NFET portion 240 of the device 201 is different from the silicide on the PFET portion 230 of the device 201. After this, the un-reacted cap layer 222 (or cap layers if the second optional cap layer is deposited as well) and metals are selectively stripped away in an etching process to form the dual salicide CMOS device 201 illustrated in FIG. 13. Additionally, the silicide materials may include $NiSi$, $CoSi_2$, $TiSi_2$, $WSi_2$, $PdSi$, $PtSi$, $TaSi_2$, $ReSi$, etc., and their alloys.

As with the first embodiment of the invention, while the above description and accompanying drawings of the second embodiment indicate that the PFET region 230 undergoes the salicide process first, the embodiments of the invention are not limited to such a sequence. Again, the NFET region 240 could equally and just as optimally undergo the salicide process first, and the embodiments of the invention are not limited to any particular sequence.

Figure 14B:
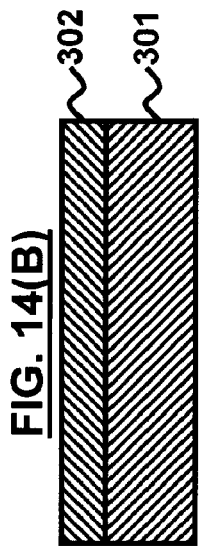
FIGS. 14(A) through 14(F) are schematic diagrams illustrating iterative steps of fabricating a self-aligned dual salicide CMOS device according to an embodiment of the invention.
Figure 14A:
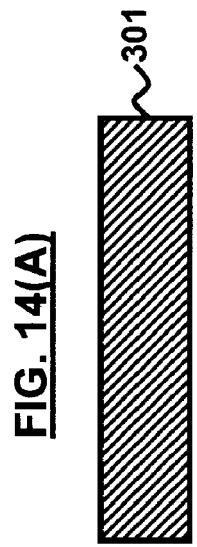
Figure 14D:
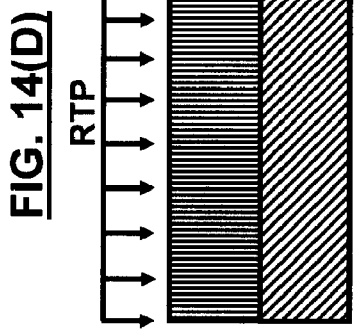
Figure 14C:
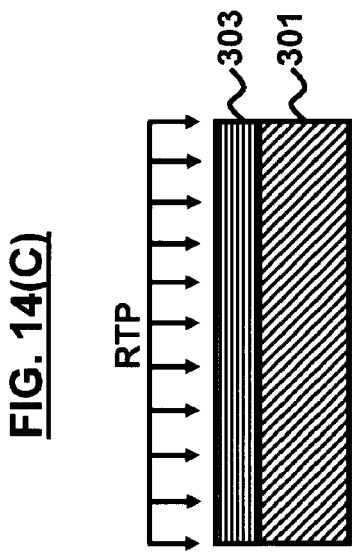
Figure 14F:
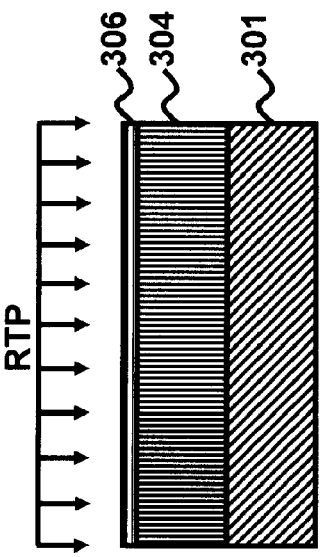
Figure 14E:
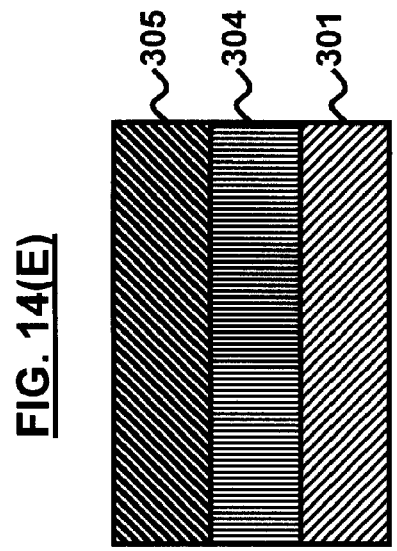

FIGS. 14(A) through 14(F) illustrate iterative steps of fabricating a self-aligned dual salicide CMOS device according to an embodiment of the invention. For example, for NiSi over $CoSi_2$, the following sequence (as shown in FIGS. 14(A) through 14(F)) could be implemented. The process begins with a Si base 301 (FIG. 14(A)) followed by deposition of a Co/TiN layer 302 over the Si base 301 (FIG. 14(B)). Then, as shown in FIG. 14(C) a first RTP is performed to form a CoSi layer 303. Next, the TiN and un-reacted Co is stripped and a second RTP is performed to form the $CoSi_2$ layer 304 (FIG. 14(D)). Thereafter, a Ni/TiN layer 305 is deposited over the $CoSi_2$ layer 304 as shown in FIG. 14(E). Next, a third RTP is performed to mimic the condition for NiSi formation. Moreover, there may remain a very thin layer 306 containing a portion of NiSi at the top of the first silicide 304, $CoSi_2$ in this case, after the TiN layer and un-reacted Ni layer are stripped away as illustrated in FIG. 14(F).

Figure 15:
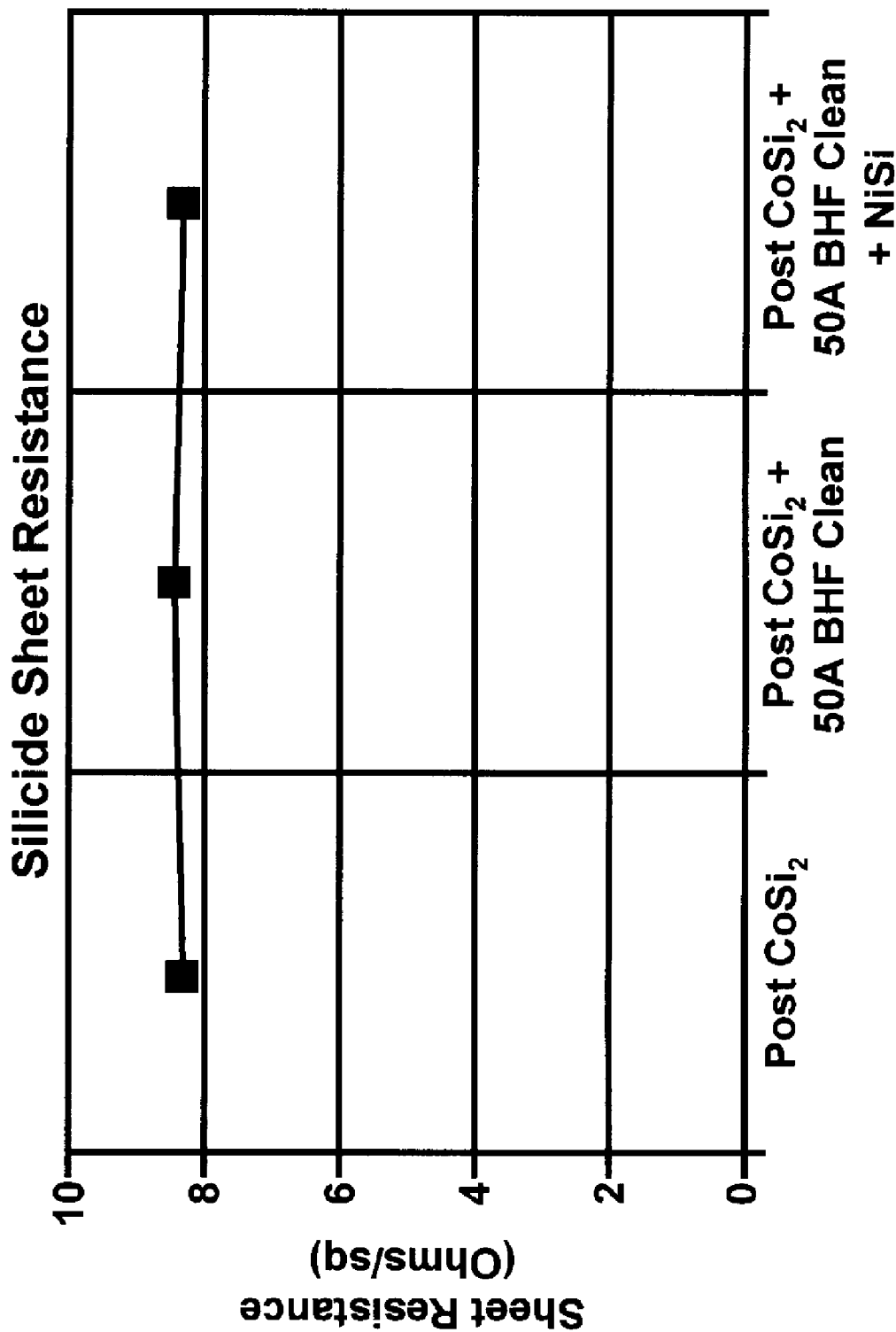
FIG. 15 is a graphical representation illustrating the silicide sheet resistance according to an embodiment of the invention.

FIG. 15 illustrates the silicide sheet resistance during three steps in the NiSi over $CoSi_2$ process illustrated in FIGS. 14(A) through 14(F). As illustrated in FIG. 15, there is no significant sheet resistance change from the first phase (post $CoSi_2$ formation) to the second phase (post $CoSi_2$ formation+50A BHF (buffered hydrofluoric acid; i.e. BOE (buffered oxide etch)) cleaning) to the third phase (post $CoSi_2$+50A BHF cleaning+NiSi formation anneal). In fact, the sheet resistance remains fairly constant throughout the three phases at approximately 8.1–8.2 Ohms/sq. Having no significant sheet resistance change is advantageous because it indicates that almost none of the second silicide (NiSi) is formed over the first silicide ($CoSi_2$). This is confirmed by the Auger electron depth profile analysis shown in FIG. 16.

Figure 16:
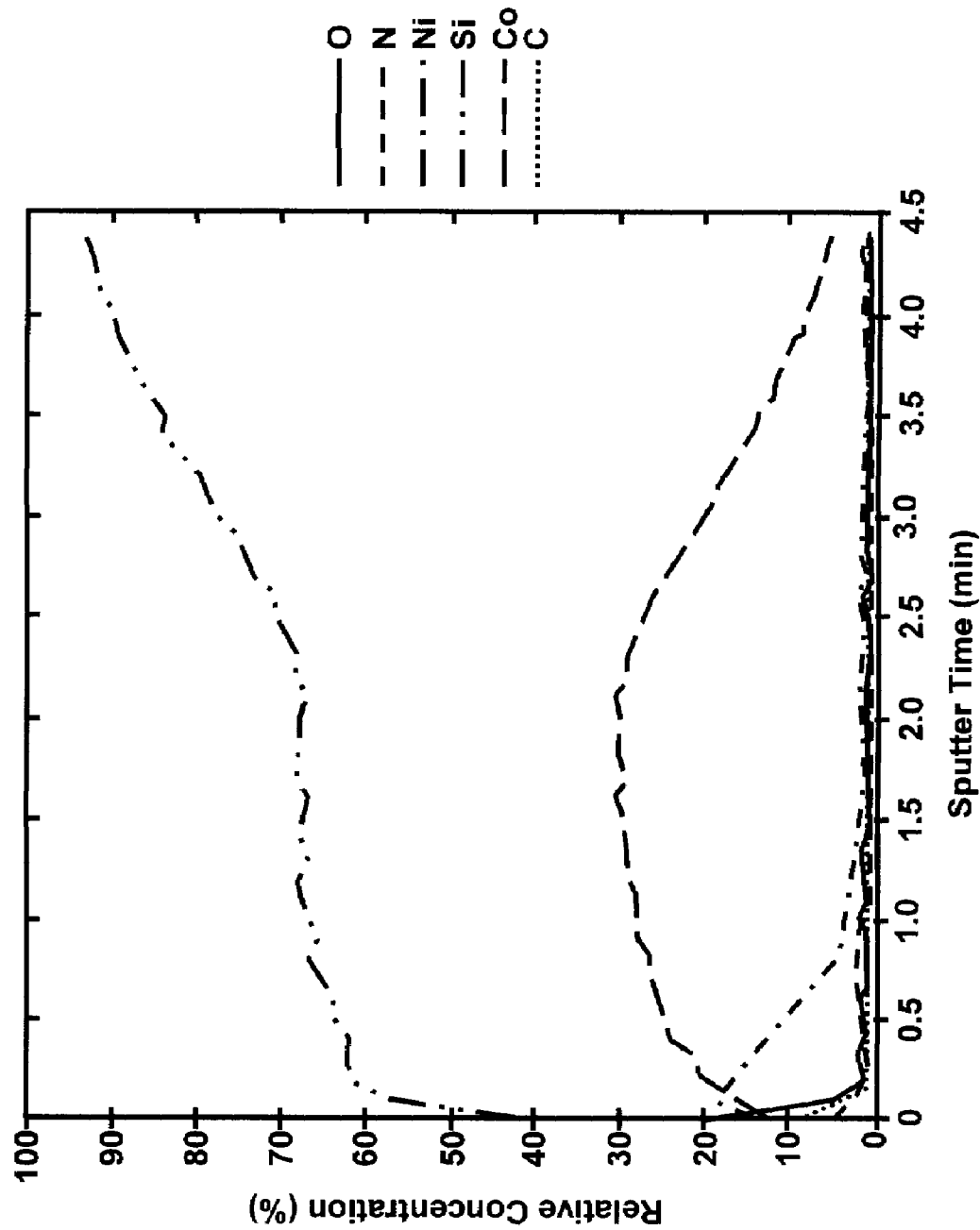
FIG. 16 is a graphical representation illustrating the relative concentration percentage versus the sputter time of a self-aligned dual silicide structure as shown in FIG. 14(F)

FIG. 16 illustrates the depth profile of the relative concentration (%) of the various materials from the final dual salicide structure shown in FIG. 14(F). It shows there is only a thin layer at the top of the final silicide having some Ni mixed in the Co silicide. FIG. 16 demonstrates that different silicides can be formed at different device areas by the embodiments of the invention.

Process flow diagrams for the first and second embodiments of the invention are illustrated in the flowcharts of FIGS. 17 and 18, which include descriptions which refer to components provided in FIGS. 6 through 16, whereby FIG. 17 depicts a method of fabricating a CMOS device 101 according to the first embodiment of the invention, wherein the method comprises forming (401) a first well region 103 in a semiconductor substrate 102 for accommodation of a first type semiconductor device 130; forming (403) a second well region 104 in the semiconductor substrate 102 for accommodation of a second type semiconductor device 140; shielding (405) the first type semiconductor device 130 with a mask 114; depositing (407) a first metal layer 118 over the second type semiconductor device 140; performing (409) a first salicide formation on the second type semiconductor device 140; removing (411) the mask 114; depositing (413) a second metal layer 123 over the first and second type semiconductor devices 130, 140; and performing (415) a second salicide formation on the first type semiconductor device 130.

The method further comprises removing the second metal layer 123 from the second type semiconductor device 140. In one embodiment, the first well region 103 is configured as a NFET well region and the second well region 104 is configured as a PFET well region. In another embodiment, the first well region 103 is configured as a PFET well region and the second well region 104 is configured as a NFET well region. Additionally, the first metal layer 118 is formed of different materials than the second metal layer 123. Furthermore, the first type semiconductor device 130 is formed by configuring an insulator layer 112 over the first well region 103; configuring a gate region 114 over the insulator layer 112; forming insulative spacers 111 on opposite sides of the gate region 114; and implanting extension and source/drain regions 129 in the first well region 103. Moreover, the second type semiconductor device 140 is formed by configuring an insulator layer 107 over the second well region 104; configuring a gate region 108 over the insulator layer 107; forming insulative spacers 109 on opposite sides of the gate region 108; and implanting source/drain regions 128 in the second well region 104. The method further comprises optionally forming a cap layer (not shown) over each of the first metal layer 118 and the second metal layer 123, wherein the cap layer (not shown) comprises any of TiN, Ti, and TaN, and wherein the first metal layer 118 and second metal layer 123 comprises any of Ti, Co, Ni, Pt, Re, W, Pd, Ta, Nb, and their alloys.

FIG. 18 illustrates the process flow according to the second embodiment of the invention, which describes a method of forming metal silicide layers over a semiconductor substrate 202, wherein the method comprises forming (501) a first well region 203 in the semiconductor substrate 202 for accommodating a first type semiconductor device 230; forming (503) a second well region 204 in the semiconductor substrate 202 for accommodating a second type semiconductor device 240; selectively forming (505) a first metal layer 221 over the second type semiconductor device 240; depositing (507) a capping layer 222 over the first metal layer 221; depositing (509) a second metal layer 223 over the capping layer 222 and the first type semiconductor device 230; and performing (511) a salicide formation on the first and second type semiconductor devices 230, 240, wherein the process of performing (511) the salicide formation is accomplished by annealing the first and second metal layers 221, 223, removing the capping layer 222, and removing un-reacted metal from the first and second type semiconductor devices 230, 240. The method further comprises optionally forming a second capping layer (not shown) over the second metal layer 223 prior to the process of performing (511) the salicide formation, wherein the capping layer 222 and the second capping layer (not shown) comprises any of TiN, Ti, and TaN, and wherein the first metal layer 221 and second metal layer 223 comprises any of Ti, Co, Ni, Pt, Re, W, Pd, Ta, Nb, and their alloys.

In one embodiment, the first well region 203 is configured as a NFET well region and the second well region 204 is configured as a PFET well region. In another embodiment, the first well region 203 is configured as a PFET well region and the second well region 204 is configured as a NFET well region. Moreover, the first metal layer 221 is formed of different materials than the second metal layer 223. Additionally, the first type semiconductor device 230 is formed by configuring an insulator layer 212 over the first well region 203; configuring a gate region 213 over the insulator layer 212; forming insulative spacers 211 on opposite sides of the gate region 213; and implanting source/drain regions 229 in the first well region 203. Furthermore, the second type semiconductor device 240 is formed by configuring an insulator layer 207 over the second well region 204; configuring a gate region 208 over the insulator layer 207; forming insulative spacers 209 on opposite sides of the gate region 208; and implanting source/drain regions 228 in the second well region 204.

Generally, the embodiments of the invention provide a double self-aligning technique of forming a dual salicide (i.e., different salicide formations), such as NiSi, $CoSi_2$, $TiSi_2$, $WSi_2$, PdSi, PtSi, $TaSi_2$, ReSi, etc., and their alloys at the source/drain and gate areas for NFET and PFET regions of a CMOS device with only one lithography level. As such, the embodiments of the invention reduce the required lithography level, greatly simplify the dual salicide formation process, and eliminate the misalignment problem associated with some conventional techniques. Moreover, the embodiments of the invention enable the optimization of the performance of the CMOS device by forming one salicide in the NFET region and a different salicide in the PFET region.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the embodiments of the invention can be practiced with modification within the spirit and scope of the appended claims.

What is claimed is:

1. A method of fabricating a complementary metal oxide semiconductor (CMOS) device, said method comprising:
   forming a fire well region in a semiconductor substrate for accommodation of a first type semiconductor device;
   forming a second well region in said semiconductor substrate for accommodation of a second type semiconductor device;
   shielding said first type semiconductor device with a mask;
   depositing a first metal layer over said second type semiconductor device;
   performing a first salicide formation on said second type semiconductor device;
   removing said mask;
   depositing a second metal layer over the first and second type semiconductor devices;
   performing a second salicide formation on said first type semiconductor device; and
   removing said second metal layer from said second type semiconductor device.

2. The method of claim 1, wherein said first well region is configured as a NFET (N-type field effect transistor) well region and said second well region is configured as a PFET (P-type field effect transistor) well region.

3. The method of claim 1, wherein said first well region is configured as a PFET (P-type field effect transistor) well region and said second well region is configured as a NFET (N-type field effect transistor) well region.

4. A method of fabricating a complementary metal oxide semiconductor (CMOS) device, said method comprising:
- forming a first well region in a semiconductor substrate for accommodation of a first type semiconductor device;
- forming a second well region in said semiconductor substrate for accommodation of a second type semiconductor device;
- shielding said first type semiconductor device with a mask;
- depositing a first metal layer over said second type semiconductor device;
- performing a first salicide formation on said second type semiconductor device;
- removing said mask;
- depositing a second metal layer over the first and second type semiconductor devices; and
- performing a second salicide formation on said first type semiconductor device,
- wherein said first metal layer is formed of different materials than said second metal layer.

5. The method of claim 1, wherein said first type semiconductor device is formed by:
- configuring an insulator layer over said first well region;
- configuring a gate region over said insulator layer;
- forming insulative spacers on opposite sides of said gate region; and
- implanting source/drain regions in said first well region.

6. The method of claim 1, wherein said second type semiconductor device is formed by:
- configuring an insulator layer over said second well region;
- configuring a gate region over said insulator layer;
- forming insulative spacers on opposite sides of said gate region; and
- implanting source/drain regions in said second well region.

7. The method of claim 1, further comprising forming a cap layer over each of said first metal layer and said second metal layer.

8. A method of fabricating a complementary metal oxide semiconductor (CMOS) device, said method comprising:
- forming a first well region in a semiconductor substrate for accommodation of a first type semiconductor device;
- forming a second well region in said semiconductor substrate for accommodation of a second type semiconductor device;
- shielding said first type semiconductor device with a mask;
- depositing a first metal layer over said second type semiconductor device;
- performing a first salicide formation on said second type semiconductor device;
- removing said mask;
- depositing a second metal layer over the first and second type semiconductor devices;
- forming a cap layer over each of said first metal layer and said second metal layer; and
- performing a second salicide formation on said first type semiconductor device,
- wherein said cap layer comprises any of TiN, Ti, and TaN.

9. The method of claim 1, wherein said first metal layer and said second metal layer comprises any of Ti, Co, Ni, Pt, Re, W, Pd, Ta, Nb, and their alloys.

10. A method of forming an integrated circuit on a semiconductor substrate, said method comprising:
- forming each of a first and second type semiconductor device on said semiconductor substrate;
- depositing a first metal layer over said second type semiconductor device;
- performing a first salicide formation on only said second type semiconductor device;
- depositing a second metal layer over both said first and second type semiconductor device; and
- performing a second salicide formation on only said first type semiconductor device.

11. The method of claim 10, further comprising shielding said first type semiconductor device with a mask prior to deposition of said first metal layer.

12. The method of claim 11, further comprising removing said mask after performing said first salicide formation.

13. The method of claim 10, further comprising removing said second metal layer from said second type semiconductor device.

14. The method of claim 10, wherein said first metal layer is formed of different materials than said second metal layer.

15. The method of claim 10, wherein said first type semiconductor device is formed by:
- configuring an insulator layer over a first well region;
- configuring a gate region over said insulator layer;
- forming insulative spacers on opposite sides of said gate region; and
- implanting source/drain regions in said well region.

16. The method of claim 15, wherein said first well region is configured as any of a NFET (N-type field effect transistor) well region and a PFET (P-type field effect transistor) well region.

17. The method of claim 10 wherein said second type semiconductor device is formed by:
- configuring an insulator layer over a second well region;
- configuring a gate region over said insulator layer;
- forming insulative spacers on opposite sides of said gate region; and
- implanting extension and source/drain regions in said second well region.

18. The method of claim 17, wherein said second well region is configured as any of a NFET (N-type field effect transistor) well region and a PFET (P-type field effect transistor) well region.

19. The method of claim 10, further comprising forming a cap layer over each of said first metal layer and said second metal layer.

20. The method of claim 19, wherein said cap layer comprises any of TiN, Ti, and TaN.

21. The method of claim 10, wherein said first metal layer and second metal layer comprises any of Ti, Co, Ni, Pt, Re, W, Pd, Ta, Nb, and their alloys.

* * * * *